United States Patent [19]
Ohashi et al.

[11] Patent Number: 5,646,824
[45] Date of Patent: Jul. 8, 1997

[54] ELECTRONIC EQUIPMENT AND LAP-TOP TYPE ELECTRONIC EQUIPMENT

[75] Inventors: Shigeo Ohashi; Toshio Hatada, both of Tsuchiura; Takeo Tanaka, Minori-machi; Susumu Iwai, Hadano, all of Japan

[73] Assignee: Hitachi, Ltd., Tokyo, Japan

[21] Appl. No.: 489,623

[22] Filed: Jun. 12, 1995

Related U.S. Application Data

[63] Continuation of Ser. No. 214,102, Mar. 17, 1994, abandoned.

[30] Foreign Application Priority Data

Mar. 17, 1993 [JP] Japan .................................. 5-056804

[51] Int. Cl.$^6$ ........................................ H05K 7/20
[52] U.S. Cl. .................. 361/699; 165/80.3; 174/15.1; 257/714; 361/704
[58] Field of Search ................. 165/80.2, 80.3, 165/80.4, 104.31, 104.33; 174/15.1, 16.1, 16.3; 257/714; 361/687–689, 699, 704, 710–711, 694–697

[56] References Cited

U.S. PATENT DOCUMENTS

| | | | |
|---|---|---|---|
| 4,698,728 | 10/1987 | Tustaniwskyj et al. | 361/699 |
| 4,791,983 | 12/1988 | Nicol et al. | 361/699 |
| 4,807,134 | 2/1989 | Tustaniwskyj et al. | 361/699 |
| 5,144,531 | 9/1992 | Go et al. | 361/699 |
| 5,285,347 | 2/1994 | Fox et al. | 361/699 |
| 5,323,847 | 6/1994 | Koizumi et al. | 361/699 |

*Primary Examiner*—Gregory D. Thompson
*Attorney, Agent, or Firm*—Antonelli, Terry, Stout & Kraus, LLP

[57] ABSTRACT

A flat shaped header having a heat receiving side is attached to a semiconductor element mounted on a circuit board. The header having the heat receiving side is connected to another header having a heat receiving side attached to a plurality of heat radiating fins so as to form a heat exchanging radiator which heat radiating fins are installed at a peripheral portion of a body of electronic equipment. The heat generated by the semiconductor element is transmitted by liquid moving between the headers via flexible tubes and then to the heat radiating fins, which heat is discharged outside of the body of equipment. Since the flat shaped header and the flexible tubes are employed, a high heat generating semiconductor element and the heat radiating fins are thermally connected with ease without being influenced by the configurational condition in the equipment even when many semiconductor elements are mounted inside a small space.

14 Claims, 8 Drawing Sheets

ELECTRONIC EQUIPMENT AND LAP-TOP TYPE ELECTRONIC EQUIPMENT

This application is a Continuation of application Ser. No. 08/214,102, filed Mar. 17, 1994, now abandoned.

BACKGROUND OF THE INVENTION

1. Field of the Invention

The present invention relates to an electronic equipment, and more particularly to an electronic equipment of which semi-conductor elements are cooled to keep their temperature below a given range.

2. Description of the Prior Art

In a conventional electronic equipment, a heat pipe is contacted to a heat generating member and the heat generated by the heat generating member is discharged by a radiating member as described in Japanese Patent Application Laid-Open No. 64-84699 (1989) and Japanese Patent Application Laid-Open No. 2-244748 (1990). Another heat transmitting technology is proposed in U.S. Pat. No. 4,590,993, where containing parts are provided at both ends of a lot of ducts, and the liquid enclosed inside is vibrated with a vibrating mechanism to transfer heat between the containing parts.

In the above prior art in Japanese Patent Application Laid-Open No. 2-244748 (1989), the heat pipe itself does not have flexibility. When the heat generating member is connected to the heat radiating member with a heat pipe in an equipment in which a heat generating member is mounted in a small space together with other members, the positions to place the heat generating member and the heat radiating member, therefore, have great influence on the configuration of the other members. Otherwise, the position placing the heat generating member has to be changed. And in the U.S. Pat. No. 4,590,993, the configuration of members inside of the equipment is extremely restricted since the structure to transfer heat between the two containing parts is a duct typed structure.

On the other hand, although the method described in Japanese Patent Application Laid-Open No. 64-84699 (1989) employs a small diameter heat pipe in order to get flexibility, there is an disadvantage in that the operating limit for heat transfer rate is small. Increasing in number of the heat pipes in order to increase heat transfer rate deteriorates its flexibility instead.

SUMMARY OF THE INVENTION

An object of the present invention is to provide a cooling equipment for cooling an electronic equipment in which a heat generating member is mounted in a small space together with other members, and the heat generated by a heat generating member is efficiently transferred to a heat radiating member placed at an arbitrary position without being influenced by the configuration of the other members in order to cool the heat generating member to keep it below a given temperature range.

The object of the present invention can be attained by providing an electronic equipment having a body of equipment containing an electronic circuit board mounting a plurality of semiconductor elements thereon, a flat shaped header in heat receiving side having in its inside a flow passage capable of flowing cooling liquid, thermally connected to at least one of the semiconductor elements, a heat exchanging radiator having in its inside a flow passage capable of flowing cooling liquid, wherein the header in heat receiving side is connected to the heat exchanging radiator with a flexible tube, a liquid transmitting mechanism to transmit cooling liquid between the header in heat receiving side and the heat exchanging radiator provided in the heat exchanging radiator, the heat exchanging radiator being positioned in isolated relationship with the semiconductor element to which the header in heat receiving side is connected.

The object of the present invention can be attained by providing an electronic equipment having a body of equipment containing electronic circuit boards mounting a plurality of semiconductor elements thereon, a flat shaped header in heat receiving side having in its inside a flow passage capable of flowing cooling liquid, thermally connected to at least one of the semiconductor elements, a heat exchanging radiator having in its inside a flow passage capable of flowing cooling liquid, wherein the electronic circuit boards mounting high heat generating semiconductor elements among the electronic circuit boards are horizontally and densely piled in multistage arrangement, the other of the electronic circuit boards mounting low heat generating semiconductor elements being vertically and thinly arrayed, the header in heat receiving side being attached to the high heat generating elements mounted on the electronic circuit boards piled horizontally, the heat exchanging radiator being installed near the side surface of the body of equipment, the header in heat receiving side and the heat exchanging radiator being connected with a flexible tube such that cooling liquid may move between the header in heat receiving side and the heat exchanging radiator.

The object of the present invention can be attained by providing an electronic equipment having a body of equipment containing an electronic circuit board mounting a plurality of semiconductor elements thereon, a first flat shaped header having in its inside a flow passage capable of flowing cooling liquid, thermally connected to at least one of the semiconductor elements, a heat exchanging radiator having in its inside a flow passage capable of flowing cooling liquid, wherein a plurality of the electronic circuit boards are installed in the body of equipment, a second header being connected to the heat exchanging radiator, a plurality of the first headers being connected to the second header with flexible tubes, a liquid transmitting mechanism to transmit cooling liquid between the first headers and the second header provided in the second header, the heat exchanging radiator being positioned in isolated relationship with the semiconductor elements to which the first headers are connected.

The object of the present invention can be attained by providing an electronic equipment having a body of equipment containing an electronic circuit board mounting a plurality of semiconductor elements thereon, a flat shaped header in heat receiving side having in its inside a flow passage capable of flowing cooling liquid, thermally connected to at least one of said semiconductor elements, a heat exchanging radiator having in its inside a flow passage capable of flowing cooling liquid, wherein the header in heat receiving side is connected to the heat exchanging radiator with a flexible tube, the heat exchanging radiator being arranged nearer to the wall of the body of equipment than the header.

The object of the present invention can be attained by providing a lap-top type electronic equipment having a first body of equipment containing an electronic circuit board mounting a plurality of semiconductor elements thereon; a second body of equipment containing a display unit and being rotatably connected to said first body of equipment, which comprises a flat shaped header in heat receiving side having a flow passage capable of flowing cooling liquid therein, thermally connected to at least one of said semiconductor elements, a heat exchanging radiator having a flow passage capable of flowing cooling liquid therein, a flexible tube connected between the header in heat receiving side and the heat exchanging radiator for transmitting cooling liquid.

The object of the present invention can be attained by providing a lap-top type electronic equipment having a first body of equipment containing an electronic circuit board mounting a plurality of semiconductor elements thereon, a flat shaped header having in its inside a flow passage capable of flowing cooling liquid, thermally connected to at least one of the semiconductor elements; a second body of equipment containing a display unit and being rotatably connected to the first body of equipment; a heat exchanging radiator having in its inside a flow passage capable of flowing cooling liquid, wherein the heat exchanging radiator being placed near the wall of the first body of equipment, the header being connected to the heat exchanging radiator with a flexible tube, a liquid transmitting mechanism to transmit cooling liquid between the header and the heat exchanging radiator being provided in the heat exchanging radiator, the heat exchanging radiator being positioned in isolated relationship with the semiconductor element to which the header is connected.

An electronic equipment according to the present invention employs a small diameter flexible tube to connect a header in heat receiving side placed on a heat generating member through high thermal conductive material with a radiator placed at a vacant space in the body of the equipment. Although a high density and compact electronic equipment has a limitation in installing a radiator, it becomes possible to radiate heat to the outside of the body of equipment by means of keeping a heat abstraction way by using a flexible tube to keep out of electronic devices such as print board, memory and the like. The heat generating member is thermally directly connected to the radiating member. Since the cooling liquid flows reciprocally or circulates between the header in heat receiving side and the radiator, the heat is efficiently transferred from the header in heat receiving side connected to the heat generating member to the radiator. Since the radiator is placed near the wall of the body of equipment, heat is easily discharged to the atmosphere. Therefore, even in an electronic equipment in which a heat generating member is mounted in a small space together with other members, the heat generated by the heat generating member can be efficiently transferred to the radiator and, in the result, can be efficiently discharged out of the body of equipment without being influenced by the configuration of the other members to cool the heat generating member with high efficiency.

DETAILED DESCRIPTION OF THE PREFERRED EMBODIMENTS

Figure 1:
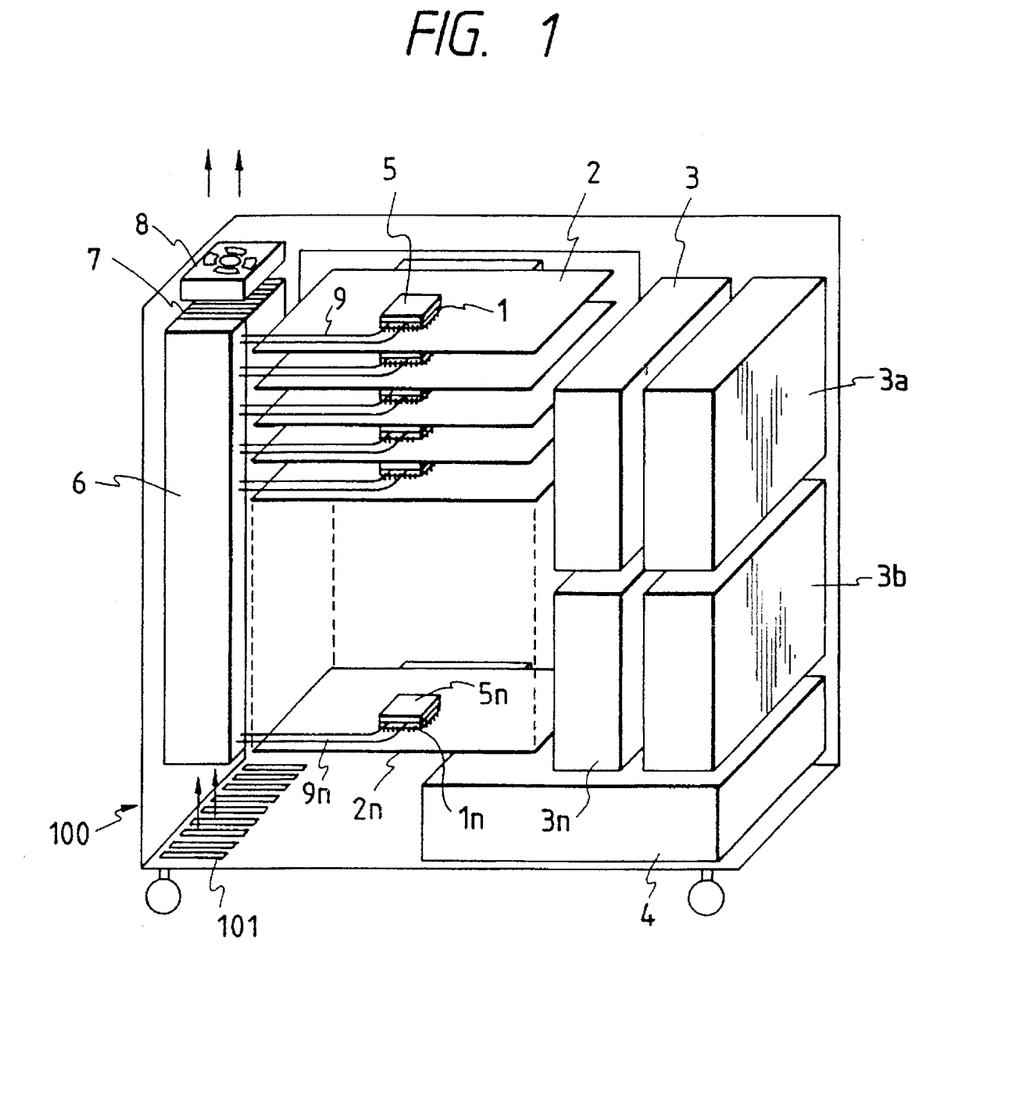
FIG. 1 is a perspective view of one embodiment of an electronic equipment in accordance with the present invention.
Figure 2:
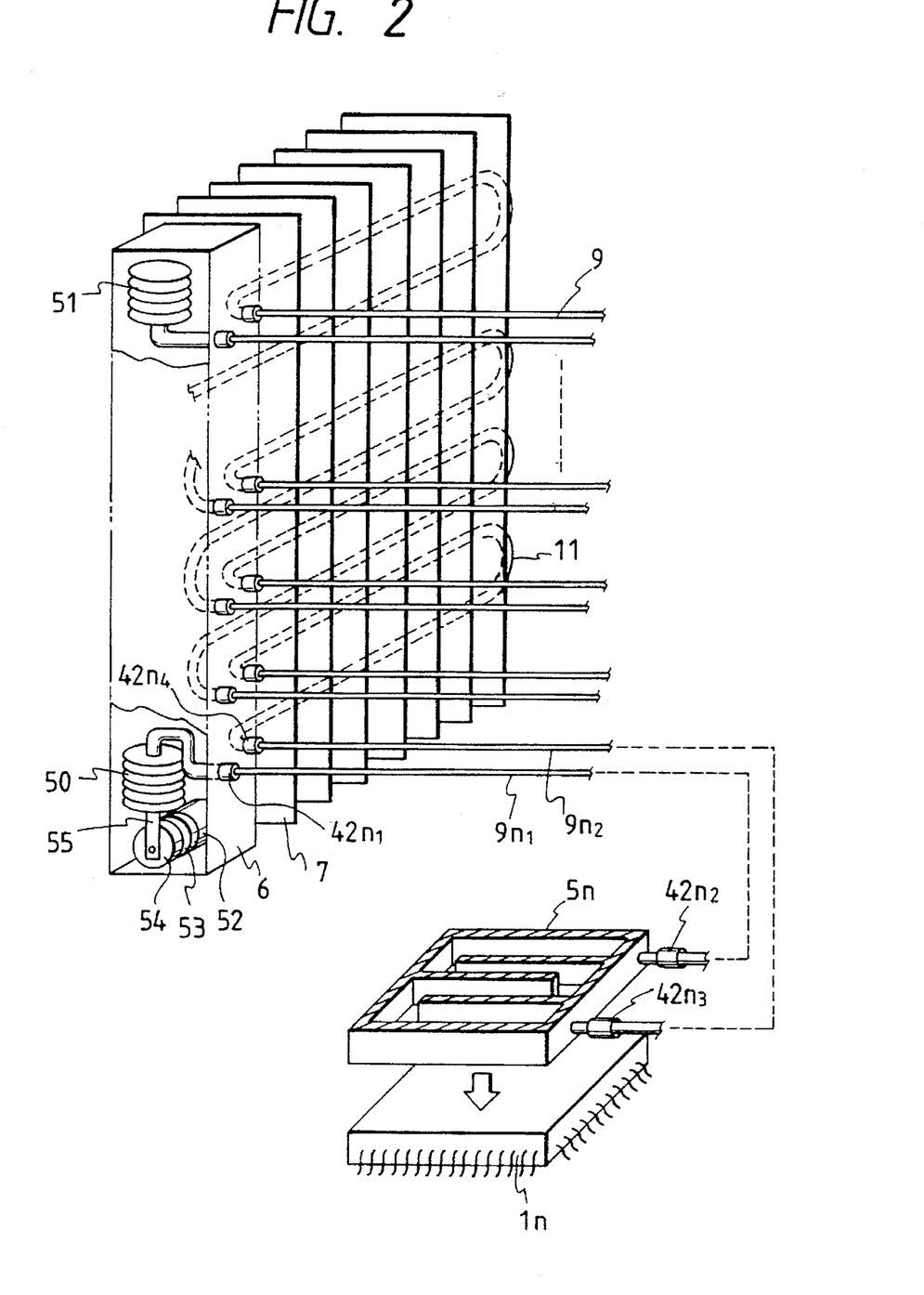
FIG. 2 is a perspective view of the cooling system in the embodiment of electronic equipment shown in FIG. 1.

FIG. 1 and FIG. 2 show an embodiment of the present invention. An electronic equipment 100 comprises a calculator composed of electronic circuit boards 2~2n horizontally and densely piled in multi-stage arrangement to form shelf-shape, a memory composed of a plurality of discs 3~3n provided in the side of the calculator, a power source 4, and a heat radiator such as a heat radiating fin 7 and a fan 8 to discharge the heat generated by the calculator, the memory, the power source and so on to the outside of the electronic equipment efficiently. Header 5~5n in heat receiving sides formed of aluminum or copper are attached to the semiconductor elements 1~1n having especially large heat generation among the semiconductor elements mounted on the circuit boards 2~2n. The semiconductor element 1 and the header 5 in heat receiving side are contacted and attached to each other with interposing thermal compound made of thermal conductive grease added zinc oxide or the like or high thermal conductive silicon rubber such that the heat generated by the semiconductor element 1 is transferred to the header 5 in heat receiving side. Assembling workability will be improved if the thermal compound or silicon rubber has adhesive property. The outline of the header 5 in heat receiving side is approximately the same in size as the semiconductor element, being flat-shaped and having thickness of several millimeters, having a cooling liquid flow passage for transmitting heat in its inside. The header 5 in heat receiving side provided on the semiconductor element 1 is connected to a header 6 in heat radiating side attached to a heat radiating fin 7 provided on the end of the body of equipment with a flexible tube 9 so that cooling liquid (for example water) flows between them. Incidentally, the heat radiating fin 7 and the header 6 in heat radiating side may be formed in one-piece structure.

The liquid enclosed in the inside of the headers 5 and 6 is moved by a liquid driving mechanism provided inside the header 6 in heat radiating side such that the liquid is reciprocally oscillated between these two kinds of headers 5 and 6. The inside of the header 6 in heat radiating side is provided with two bellows 50 and 51, a driving motor 52, a reduction gear mechanism 53, an eccentric driving disk 54, and a connecting rod 55. The motor 52 rotates the eccentric disk 54 to extend and contract the bellows 50 through the connecting rod 55. The bellows 50 is connected to one end of a flexible tube $9n_1$ with a connector $42n_1$. The other end of the flexible tube $9n_1$ is connected to one end of the flow passage of the header $5n$ in heat receiving side with a connector $42n_2$. One end of a flexible tube $9n_2$, the other end of which is connected to a connector $42n_3$ provided on the other end of the flow passage of the header $5n$ in heat receiving side, is connected to a connector $42n_4$ on the header 6 in heat radiating side. The connector $42n_4$ communicates with a heat radiating pipe 11 made of copper or aluminum which penetrates through an array of radiating fins Y formed by arraying copper or aluminum plates vertically. The other end of the heat radiating pipe 11 returns to the header 6 in heat radiating side, and sequentially communicates with a header in heat receiving side in the next upper stage through the next flexible tube. And the endmost end of the flexible tube 9 communicates with the bellows 51.

When the bellows 50 is contracted with the rotation of the motor 52, the cooling liquid is pushed out into the flexible tube $9n_1$, flowing through the header $5n$ in heat receiving side to receive heat, flowing into the heat radiating pipe 11 through the other side of the flexible tube $9n_2$ to discharge heat, then flowing to the header in heat receiving side in next stage. The cooling liquid pushed out of the endmost end is absorbed with the extension of the bellows 51. When the bellows 50 is extended, the liquid flows in the opposite direction. The liquid is oscillatorily moved with repeat of the action described above.

The mechanism of cooling is that by means of such movement of the liquid the heat extracted from the semiconductor elements $1$~$1n$ through the headers $5$~$5n$ in heat receiving side is transmitted through the header 6 in heat radiating side to and discharged from the heat radiating pipe 11 and the heat radiating fins 7. Although the reciprocal oscillating cycle, the oscillating stroke and the inner diameter of the flexible tube for the liquid driving system are determined corresponding to the heat generating rate of the semiconductor elements cooled, it is preferable to set the reciprocal oscillating cycle less than several Hz, the inner diameter of the tube around 2 mm, and the distance of liquid oscillating movement inside the tube less than the length of the tube.

According to such electronic equipment, air can be efficiently sent to the radiating fins 7 using the cooling fan and heat can be efficiently exchanged with external air, since the heat radiating fins 7 can be installed in a place having enough room to install it and being near an air opening 101 for example such as a place along the side wall in the end portion of the body of equipment.

According to the embodiment, the header in heat receiving side can be arbitrarily connected to the header 6 in heat radiating side by using the flat-shaped header 5 in heat receiving side and the flexible tube 9 with keeping out of the other members even when a lot of semiconductor elements are mounted on the circuit board $2$~$2n$ horizontally and densely piled in multi-stage arrangement in a small space, and the high heat generating semiconductor elements 1 and the heat radiating fins 7 are thermally connected to each other without being influenced by the configuration inside the equipment. Since the heat radiating fins 7 can be installed in a place near the outer wall of the body of equipment where high heat discharging rate can be obtained, the calculator and the memory can be preferentially arranged in the limited space inside the body of equipment so that the semiconductor elements 1 can be efficiently cooled without deteriorating the performance of the electronic equipment. Since the required space above the semiconductor elements 1 is small, the group of circuit boards can be densely piled, and the high performance and miniaturization of equipment can be attained. Furthermore, since there is no need to blow a high velocity air flow inside small room forcibly, the power required for cooling can be lessened and noise can be decreased.

The liquid driving mechanism may be installed separately from the header 6 in heat radiating side, and a rotary pump may be employed when a recirculating system is employed as the flow passage to circulate the liquid.

Figure 3:
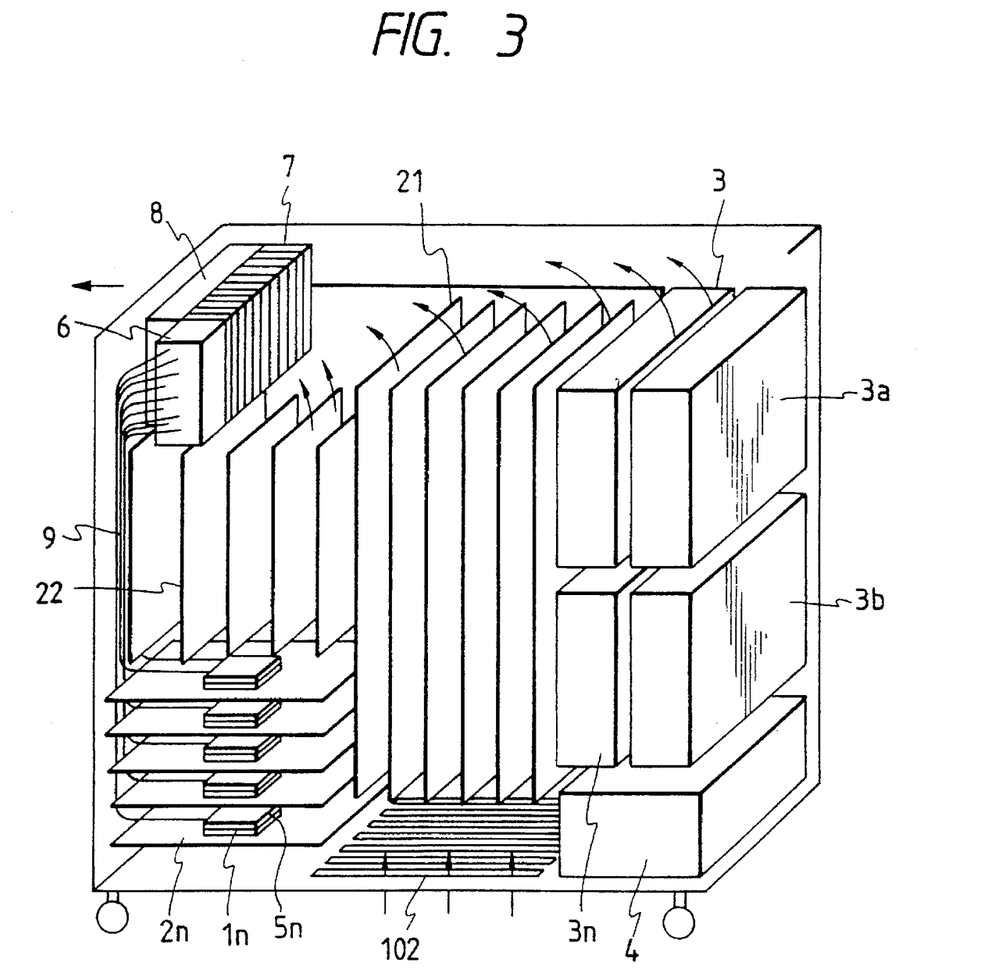
FIG. 3 is a perspective view of another embodiment of an electronic equipment in accordance with the present invention.

FIG. 3 shows another embodiment of the present invention. Wherein like parts in this figure are denoted by the same reference numerals as in the first embodiment. The different point in this embodiment from the first embodiment is that a set of circuit boards 21 and 22 mounting comparatively low heat generating semiconductor elements are vertically and thinly arrayed. And air outside of the body of equipment is caused to flow inside the body of the equipment through an air inlet opening 102 on the bottom surface of the body of equipment by a cooling fan 8 to cool the low heat generating semiconductor elements and disc units $3$~$3n$ mounted on the set of circuit boards 21 and 22 with the air flow.

According to this embodiment, the circuit boards 2 having high heat generating elements can be densely mounted and the circuit boards 21 and 22 having low heat generating elements can be mounted in a comparatively wide space provided with cooling air passages, which leads to a high efficiency operation of electronic equipment. Further, since heat radiating fins are installed with making use of the limited space in the body of equipment in a place where high heat radiating efficiency can be attained, the semiconductor elements can be efficiently cooled. Furthermore, since the heat generating parts mounted in the body of equipment can be cooled without forming complex air flow passages, power required for cooling can be decreased and noise can be lessened.

Figure 4:
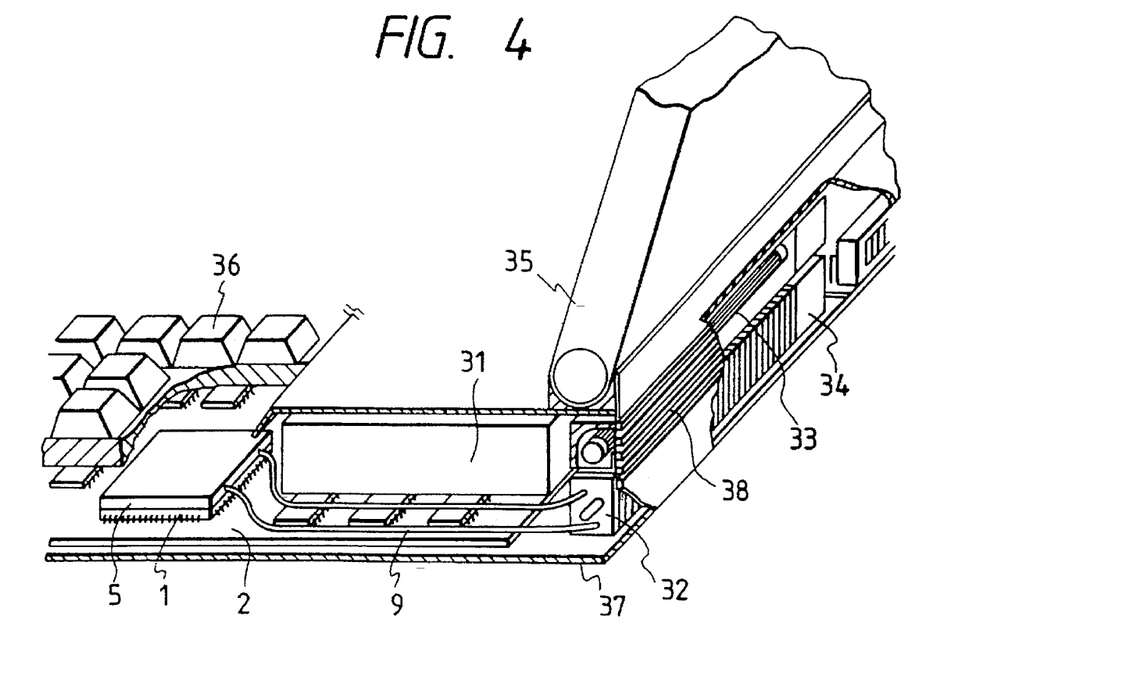
FIG. 4 is a perspective cross-sectional view of another embodiment showing a part of an electronic equipment in accordance with the present invention.

FIG. 4 shows a further embodiment according to the present invention. The electronic equipment in this embodiment is such as a lap-top type personal computer or word processor, and comprises a circuit board 2 mounting a plurality of semiconductor elements, key boards 36, a disc unit 31, a display unit 35 and so on. A header 5 in heat receiving side is connected to the semiconductor element 1, especially large heat generating element, among the semiconductor elements mounted on the circuit board 2 as the same as in the embodiment described above. The semiconductor element 1 and the header 5 in heat receiving side are contacted to each other with interposing thermal compound or high thermal conductive silicone rubber. The header 5 in heat receiving side connected to the semiconductor element 1 is connected with a flexible tube 9 to a heat exchanging radiator 32 which is installed in the back end portion of a body of equipment 37 where a space enough to radiate heat can be shared. The liquid is enclosed inside the header 5 in heat receiving side and is transmitted between the header 5 in heat receiving side and the heat exchanging radiator 32 with a liquid driving mechanism 34. The heat exchanging radiator 32 installed in the back end of the body of equipment 37 is provided and coupled with a cross flow fan 33 to send air through an air outlet opening 38. Since the header 5 in heat receiving side and the heat exchanging radiator 32 are connected to each other with the flexible tube 9, high heat radiating efficiency for the high heat generating semiconductor element 1 can be obtained even in an office automation equipment mounting a lot of parts in a very small space inside its body of equipment. And since the semiconductor elements in an electronic equipment are easily connected to the heat exchanging radiator 32 installed in a place having enough room, the semiconductor elements can be efficiently cooled.

Figure 5:
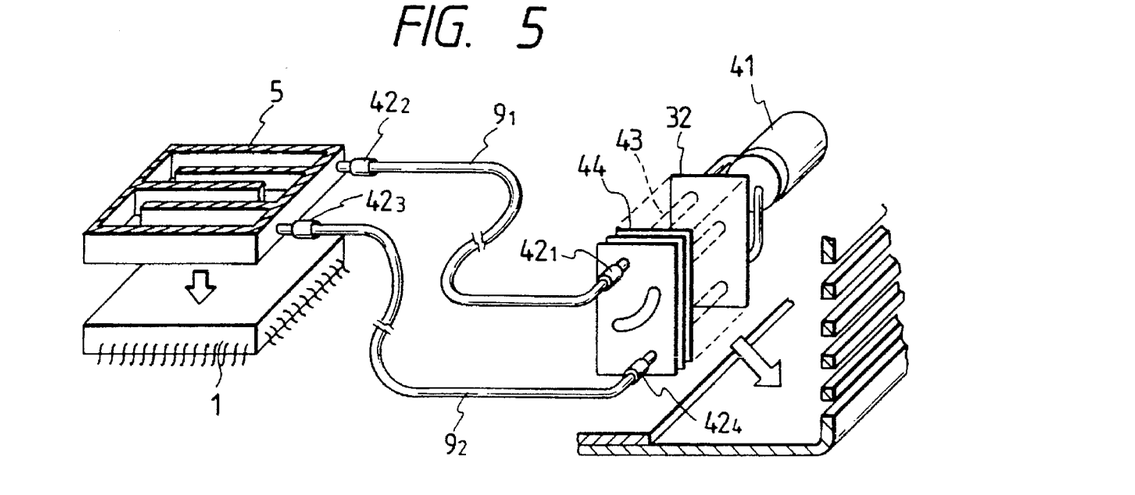
FIG. 5 is an illustrative view showing the construction of an embodiment of a cooling system in accordance with the present invention.

Cooling mechanism in the embodiments shown in FIG. 1 through FIG. 4 will be described below in detail referring to FIG. 5 through FIG. 8. FIG. 5 shows an example where a flat shaped header 5 in heat receiving side and a heat exchanging radiator 32 are connected to each other with a plurality of flexible tubes $9_1$ and $9_2$ to form a cooling liquid circulating flow passage and liquid, for example water, is enclosed inside them. The liquid is circulated between the header 5 in heat receiving side and the heat exchanging radiator 32 by a small size pump 41. The header 5 in heat receiving side, the heat exchanging radiator 32 and the flexible tubes $9_1$ and $9_2$ have detachable constructions by using connectors $42_1$ through $42_4$. Fins are provided inside the header 5 in heat receiving side in order to form a liquid flow passage and to efficiently transfer heat from the wall of header to the liquid. The size of the header 5 in heat receiving side may be voluntarily determined depending on the size of heat generating member such as semiconductor element 1. And the header 5 in heat receiving side is thermally contacted to the heat generating member by means of direct contact or the like. The header in heat receiving side may have such a structure that a metallic tube is welded to a metallic plate (copper, aluminum or the like).

The heat exchanging radiator 32 is, for example, formed by such a way that a lot of metallic plates 44 are fixed to a plurality of metallic tubes 43 such as copper. The heat exchanging radiator 32 is installed in a place where there is enough room to be able to obtain sufficient heat radiation efficiency. Since the header 5 in heat receiving side and a heat exchanging radiator 32 are connected to each other with a plurality of flexible tubes $9_1$ and $9_2$, they can be thermally connected to each other efficiently regardless of configurational relationship between the heat generating portion and the heat radiating portion.

Figure 6:
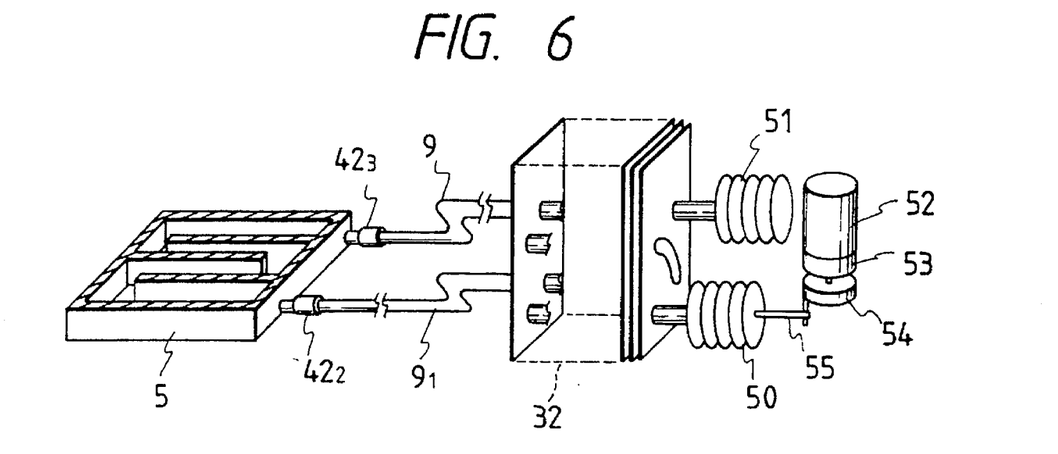
FIG. 6 is a perspective cross-sectional view of another embodiment of a cooling system in accordance with the present invention.

In the embodiment shown in FIG. 6, a flat shaped header 5 in heat receiving side and a heat exchanging radiator 32 are connected to each other with a plurality of flexible tubes $9_1$ and $9_2$ through connectors $42_2$ and $42_3$. Bellows 50 and 51 are provided in the heat exchanging radiator 32. One of the bellows 50 is provided with a driving mechanism and liquid such as water is enclosed in the inside of it. When the bellows 50 is extended and contracted by the driving mechanism, volumetric change of the liquid inside the bellows 51 on the heat exchanging radiator 32 contracts and extends the bellow 51 through the heat exchanging radiator 32, the flexible tube $9_1$, the header 5 in heat receiving side and the flexible tube $9_2$. As the result of this, the liquid is reciprocally oscillates between the heat receiving header 5 and the heat exchanging radiator 32.

The liquid driving mechanism is, for example, constructed such that the bellows 50 is jointed to a connecting rod 55 which is eccentrically connected to an eccentric driving disk 54 rotated by a driving motor 52 through a reduction gear 53. When the eccentric driving disk 54 is rotated, the connecting rod 55 is reciprocally moved with disk rotation to extend and contract the bellows 50. A cam member may be employed instead of the eccentric driving disk to be rotated and directly extend and contract the bellows. According to this embodiment, the heat generated by a heat generating member can be efficiently transmitted to a heat exchanging radiating member to cool the heat generating member by means of reciprocally oscillating liquid between a header in heat receiving side and a heat exchanging radiator even in a case where an equipment mounts a heat generating member in a small space together with other members and the heat generating member and the heat exchanging radiating member are limited in configuration position.

In the embodiment in FIG. 6, the header 5 in heat receiving side is connected to the external mounting bellows 50 and 51 through the heat exchanging radiator 32. On the other hand, an embodiment in FIG. 7 in which a header 60 in heat radiating side as well as the header in heat receiving side is made flat shaped and incorporates with a bellows and a driving mechanism. The liquid containing part of the header 60 in heat radiating side is divided into two rooms 66 and 67 each of which have bellows 61 and 62 respectively. One of the bellows 61 is provided with a driving mechanism. In this driving mechanism, an L-shaped member 64 attached to the bellows 61 is rotatably supported at a fulcrum 65, and the bellows 61 is extended and contracted by means of attracting and releasing the L-shaped member 64 using a solenoid coil 63 to move the liquid. A combination of driving motor, reduction gear, eccentric driving disk and connecting rod may be employed in the driving mechanism as shown FIG. 6, or, a small size rotary pump may be employed in the driving mechanism as shown in FIG. 5 instead of the bellows. In this embodiment, one of the header 5 for receiving heat is attached to the heat generating member, and the other of the header 60 for radiating heat is attached to the heat radiating member. Since the liquid can be transmitted between the both headers, the heat generated by the heat generating member can be efficiently transmitted to the heat radiating member. Further, since the system is constructed only with flat shaped headers and flexible tubes, the degree of freedom in the shape and the configuration for the heat radiating member becomes large.

In the embodiment described above, resin such as silicone rubber, ethylene tetra-fluoride resin may be used as the material for the flexible tube, and the flexible tube having inner diameter smaller than 2 mm can be employed. Therefore, the electronic equipment is able to have an extremely flexible construction. The smaller the inner diameter of the flexible tube is, the higher the efficiency in heat transmission. However, the number of the flexible tube to be used increases since the absolute amount of heat capable of transmitting heat decreases. And the tube similar to one Used for catheter is preferable to be employed as the flexible tube for this purpose.

Figure 8:
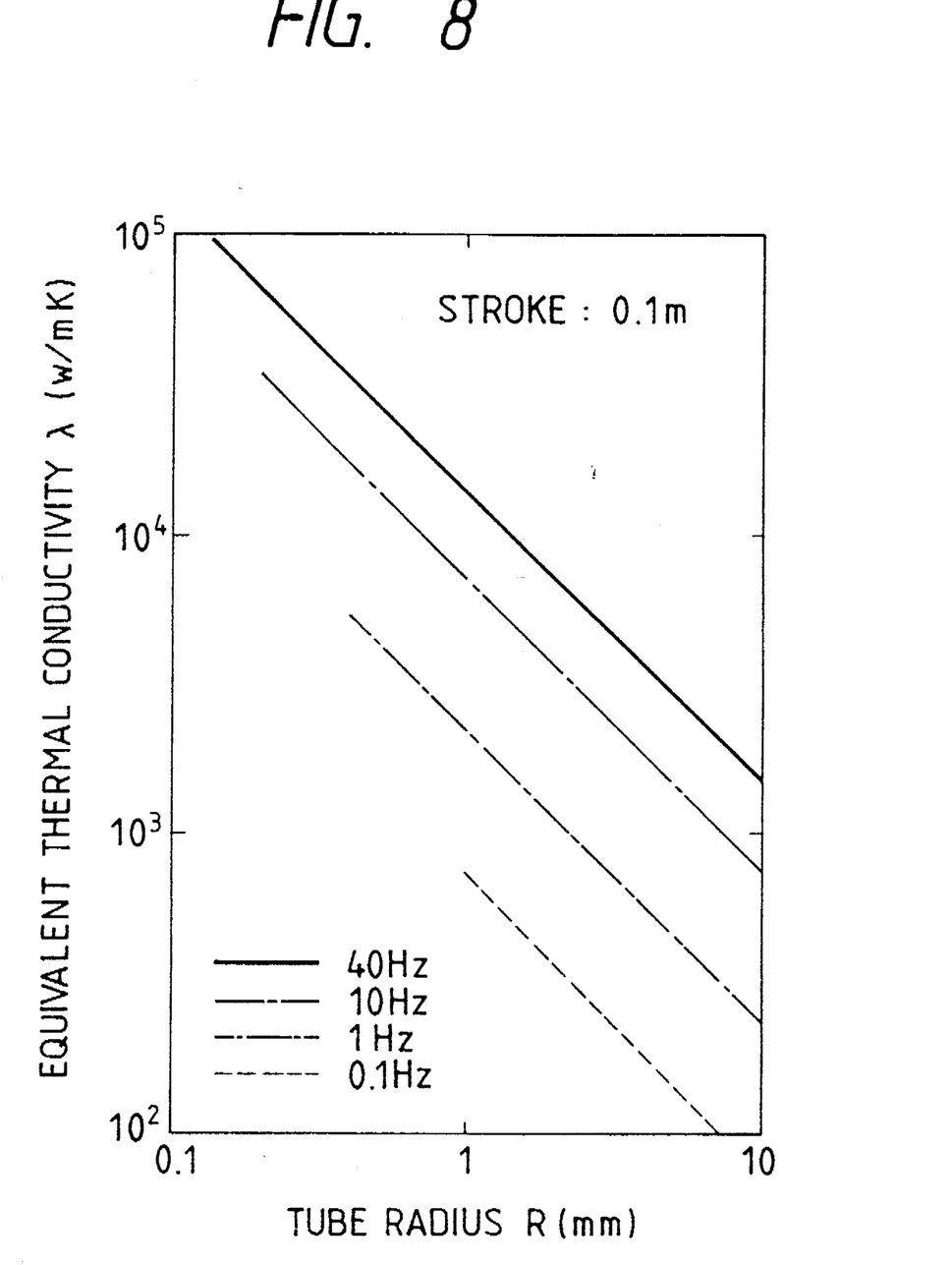
FIG. 8 is a characteristic diagram for heat transmission concerning the diameter of liquid transmitting tube.

Although there have been described the cases where the cooling liquid transmission between the header 5 in heat receiving side and the heat exchanging radiating member is circulated and is reciprocally oscillated, in a case where a semiconductor element generating heat around 10 W per element is cooled by using water the following method may be employed. That is, it is considered that heat is transmitted in a distance of 200–300 mm. In a case where liquid is reciprocally oscillated, the amount of water approximately 1 cubic centimeter is oscillated with 1–2 Hz. Incidentally, the amount of heat transmission depends on the inner diameter of the tube, the oscillating liquid volume and the oscillating frequency. When the oscillating liquid volume is constant, the amount of heat transmission can be increased by means of decreasing the tube diameter or increasing the oscillating frequency. This relationship is shown in FIG. 8 as a relationship between the inner diameter (radius) of tube and the heat transmission performance with the oscillating frequency as a parameter and for a case where the liquid oscillating stroke in the tube is 0.1 m. The ordinate in FIG. 8 denotes the heat transmission performance, which is the equivalent thermal conductivity λ when the heat transmission in the tube direction is expressed with an equation equivalent with heat conduction. It can be understood from FIG. 8 as the operating condition that the higher the oscillating frequency is, the higher the heat transmission performance can be obtained. However, the higher the oscillating frequency is, the larger the mechanical load in the liquid driving mechanism increases. Employing small diameter tubes makes ont only the construction more flexible but also the oscillating frequency lower. According to FIG. 8, for example, when the tube radius is reduced to approximately 1/3.2, the frequency to obtain the same equivalent thermal conductivity becomes 1/10. Incidentally, a small diameter metallic tube may be employed as the tube as far as the tube has flexibility.

On the other hand, in a case of the liquid circulation type, the water is circulated with flow rate of approximately 0.22 cc/s. In this case, the amount of heat transmission depends on the circulating flow rate, not depending on the tube length. That is, the amount of heat transmission can be easily controlled by means of controlling the rotating speed of the motor 52 in the liquid reciprocal oscillating type, and controlling the rotating speed of motor for the rotary pump 41 in the liquid circulating type.

Figure 7:
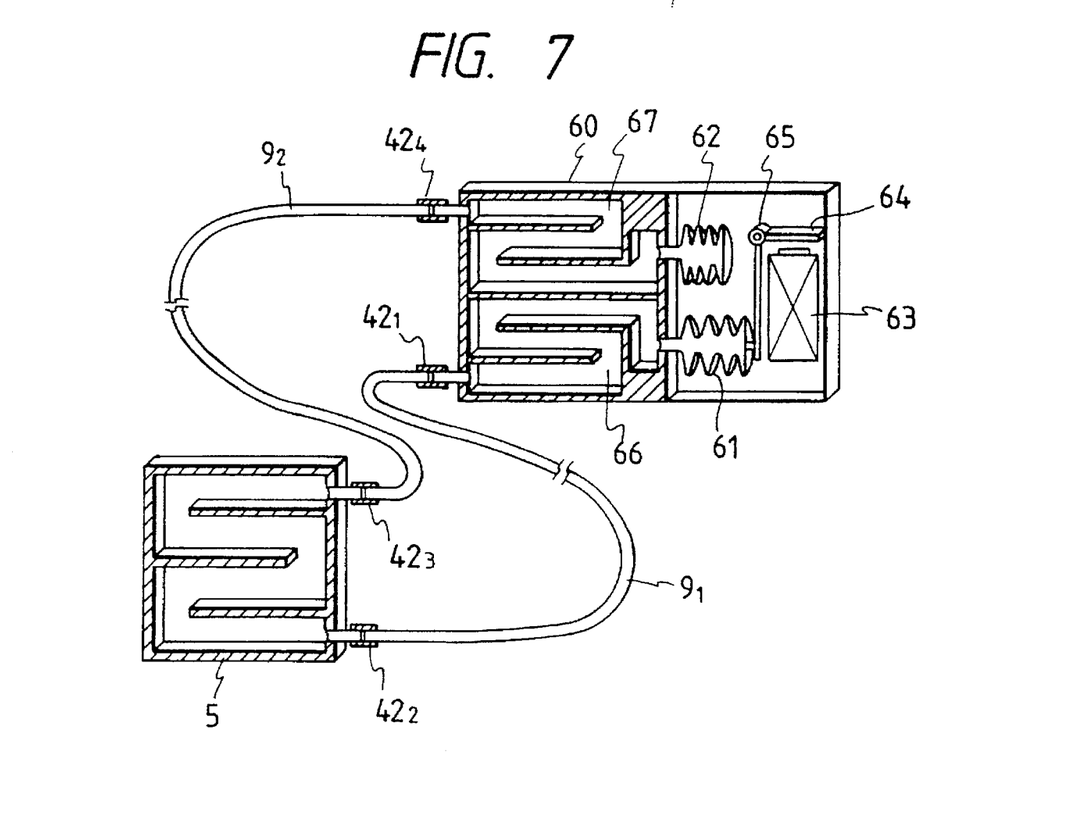
FIG. 7 is a perspective cross-sectional view of another embodiment of a cooling system in accordance with the present invention.
Figure 9:
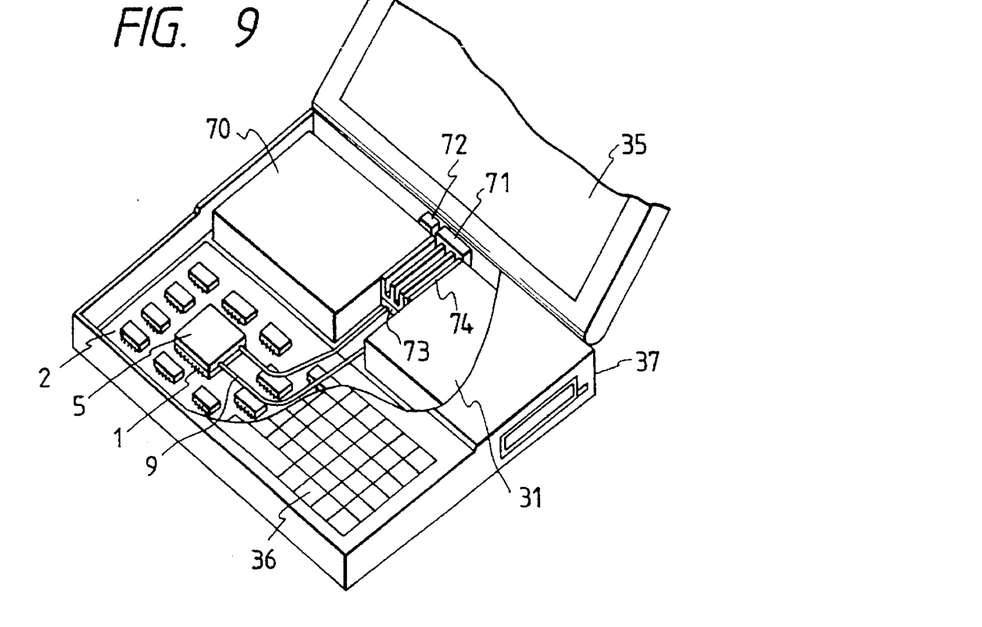
FIG. 9 is a perspective cross-sectional view of another embodiment of an electronic equipment in accordance with the present invention.

FIG. 9 shows another embodiment according to the present invention. The electronic equipment in this case is a lap-top type office automation equipment. The different point which differs from the embodiment shown in FIG. 4 is that radiating fins are mounted inside the body of equipment in this embodiment. A battery 70, heat radiating fins 74 near the battery and a fan 71 for sending air to the heat radiating fins 74 are contained inside the body of equipment 37, a header 5 in heat receiving side mounted on a heat generating member, that is a semiconductor element, and a header 73 in heat radiating side having heat radiating fins being connected to each other with a flexible tube 9, liquid enclosed inside the flexible tube 9 being transmitted with a liquid driving mechanism 72. The liquid driving mechanism 72 may be incorporated with the header 73 in heat radiating side as shown in FIG. 7. And the heat radiating fins 74 and the header 73 in heat radiating side may be of one piece structure.

According to the embodiment, the header 5 in heat receiving side and the portion of the heat radiating fin 74 can be connected to each other with the flexible tube 9 even when the heat radiating fins 74 is installed in a limited space in the body of equipment 37. Therefore, the high heat generating semiconductor element 1 and the heat radiating fins 74 can be thermally connected to each other and the heat radiating fins 74 can be efficiently exchanged heat with air by the aid of the fan 71 installed in the margin of the body of equipment even in a case where a lot of parts are mounted inside a very small space in the body of equipment 37. Consequently, semiconductor elements can be efficiently cooled without being influenced by the mounting configuration of electronic equipment.

Figure 10:
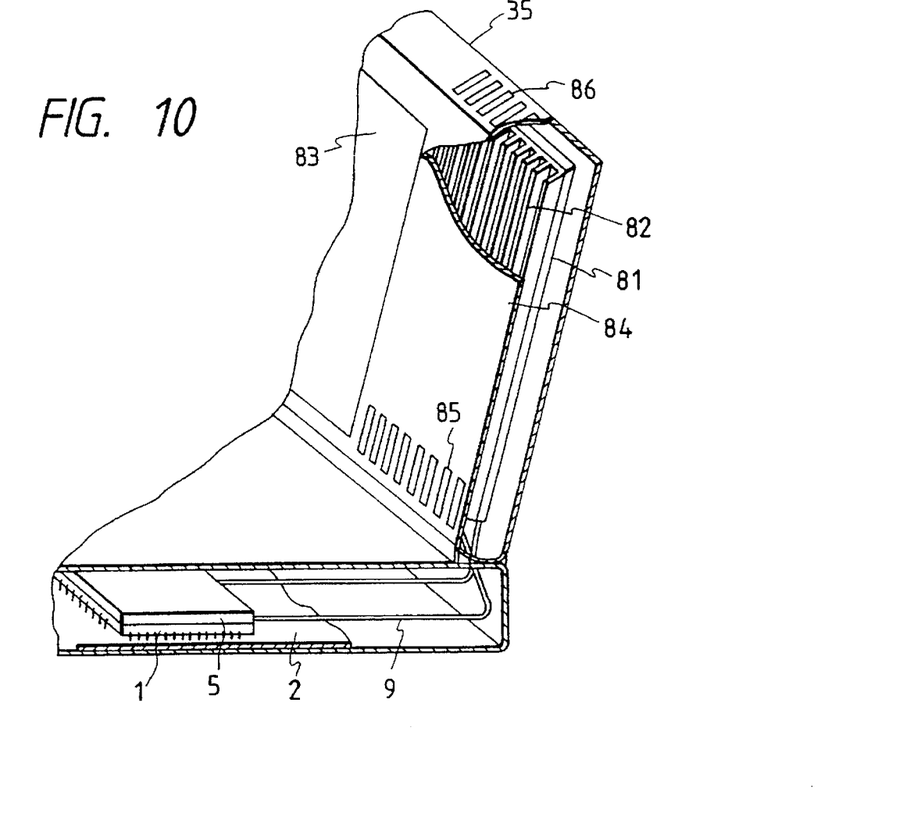
FIG. 10 is a perspective cross-sectional view of a further embodiment of an electronic equipment in accordance with the present invention.

FIG. 10 shows a further embodiment according to the present invention which is an electronic equipment similar to one in FIG. 9. A header 5 in heat receiving side is connected to a semiconductor element 1 especially having large heat generation among the semiconductor elements mounted on a circuit board 2. The header 5 in heat receiving side connected to the semiconductor element 1 is connected to a header 81 in heat radiating side attached to a heat radiating fins 82 installed in a space beside a display device 83 on the reverse side of a display unit 35 with a flexible tube 9. Liquid is contained in the headers 5 and 81, and the liquid is transmitted between the both headers with a liquid driving mechanism incorporated in the header 81 in heat radiating side. The heat radiating fins 82 and the header 81 in heat radiating side may be of one-piece structure. The heat radiating fins 82 have a role to enlarge heat transfer area, and, at the same time, to form an air flow duct between the wall 84 of a body of display unit. Air flow openings 85 and 86 are provided at positions corresponding to the upper and down parts of the heat radiating fins on the body of display unit. The air flown in through the air flow opening 85 at the down portion of the display unit passes across the heat radiating fins 82, and then is discharged out of the air flow opening 86 at the upper portion of the display unit. Therefore, high heat discharging effect due to natural convection can be obtained with the duct structure.

According to this embodiment, since the header 5 in heat receiving side and the heat radiating fins 82 are connected with the flexible tube 9, it is easy to connect thermally the high heat generating semiconductor element 1 and the heat radiating fins 82 each other even in a condition where a lot of parts are mounted in a very small space of the body of equipment. And since the heat radiating fins 82 can be installed with making use of nearly vertical condition of the display unit 35, an efficient heat radiation can be obtained by means of natural convection.

When the heat generation of the semiconductor element 1 is small, the header 81 in heat radiating side may be contacted to the back surface of the display unit 35 to make use of the back surface of the display unit as a heat radiating surface without using the heat radiating fins 82. Especially, when metallic material is employed as the wall of the body of equipment, the cooling method described above is effective since heat is diffused by the large surface area.

Figure 11:
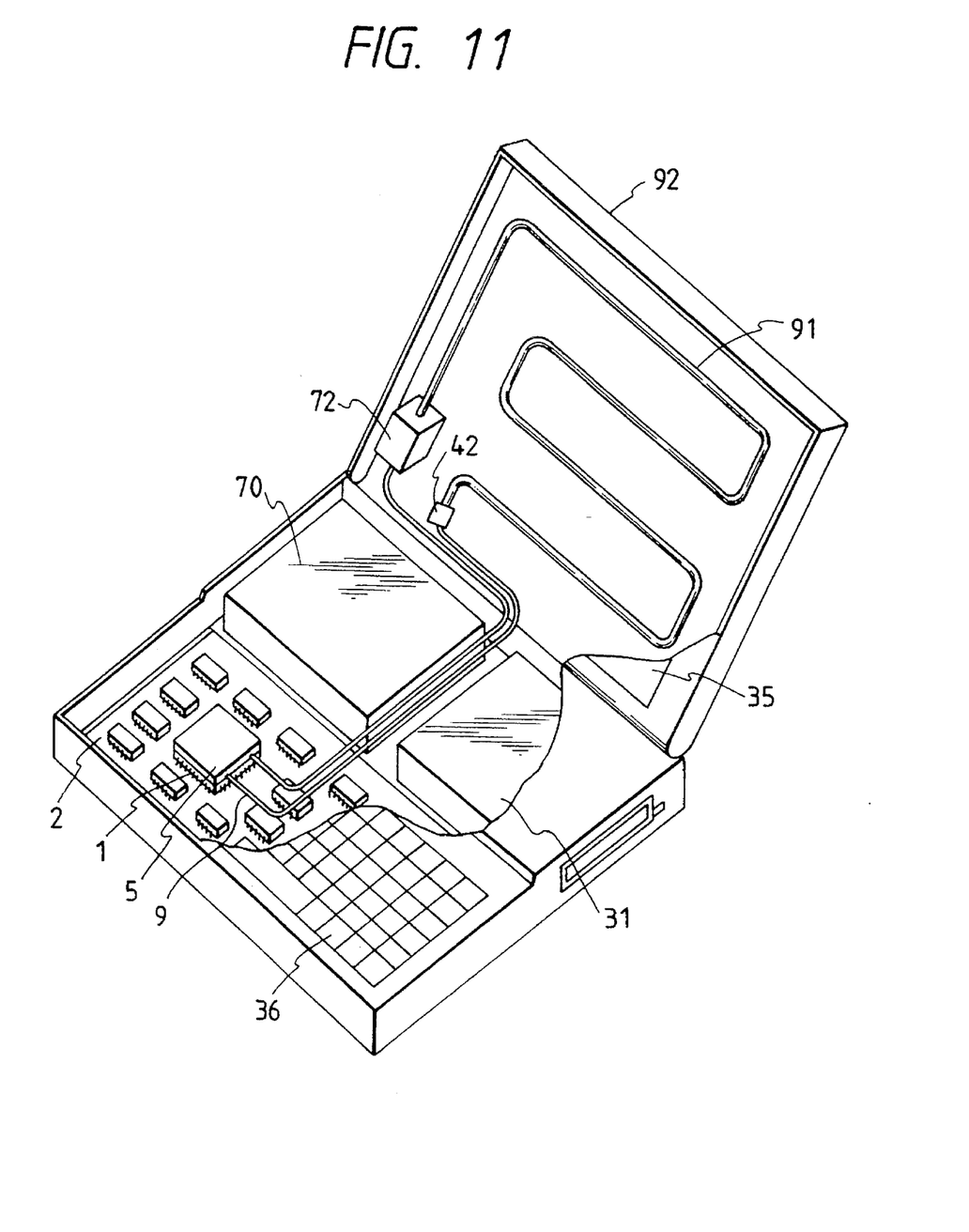
FIG. 11 is a perspective cross-sectional view of a further embodiment of an electronic equipment in accordance with the present invention.

FIG. 11 shows a further embodiment according to the present invention. The different point in the electronic equipment in this figure from ones in the embodiments shown by FIG. 4, FIG. 9 and FIG. 10 is that a metallic pipe 91 for liquid flow passage is welded to a metallic body 92 of display unit. One end of the metallic pipe 91 is connected to a liquid driving mechanism 72, the other end being connected to a flexible tube 9 through a connector 42, a header 5 in heat receiving side being connected to the liquid driving mechanism 72 with a tube 9. The liquid driving mechanism 72 reciprocally oscillates or circulates the enclosed liquid between the header 5 in heat receiving side and the metallic pipe 91.

According to this embodiment, since the heat generating part and the heat radiating part are connected with the flexible tube even in a condition where a lot of parts are mounted in a very small space of the body of equipment, the heat generated by the heat generating part can be efficiently transmitted to the heat radiating part without being influenced by the mounting configuration. And since the heat is diffused in the large surface area of the back surface of the display unit, an efficient cooling of semiconductor element can be obtained.

According to the present invention, a heat radiating member can be installed in a place where high heat radiating efficiency is obtained without being influenced by the configurational condition of the other members even when the heat generating member is mounted in a small space together with the other members. The heat generated by a heat generating member can be transmitted to the heat radiating member with cooling liquid, and, at the same time, the power required for cooling can be decreased and the noise can also be decreased.

We claim:

1. An electronic equipment comprising a body of equipment containing at least one electronic circuit board mounting a plurality of semiconductor elements thereon, at least one flat shaped header having a heat receiving side with an inside flow passage capable of flowing cooling liquid and thermally connected to at least one of said semiconductor elements, and a heat exchanging radiator having an inside flow passage capable of flowing cooling liquid, wherein said at least one header having the heat receiving side is thermally connected to said heat exchanging radiator by at least one flexible tube, and further comprising a liquid transmitting mechanism to reciprocally transmit cooling liquid between said at least one header having the heat receiving side and said heat exchanging radiator, said liquid transmitting mechanism being provided in said heat radiating side, said heat exchanging radiator being positioned in isolated relationship with the at least one semiconductor element to which said at least one header having the heat receiving side is thermally connected.

2. An electronic equipment according to claim 1, wherein:
said liquid transmitting mechanism comprises at least a pair of bellows which are respectively provided at each end of the flow passage in said heat radiating side.

3. An electronic equipment according to claim 1, wherein:
said heat exchanging radiator comprises a plurality of metallic plates attached to a pipe providing the flow passage therein.

4. An electronic equipment according to claim 1, wherein:
said heat exchanging radiator is attached to a wall of said body of equipment.

5. An electronic equipment according to claim 1, wherein:
said heat exchanging radiator is arranged nearer to a wall of said body of equipment than to said header having the heat receiving side.

6. An electronic equipment comprising a body of equipment containing at least one electronic circuit board mounting a plurality of semiconductor elements thereon, at least one first flat shaped header having an inside flow passage capable of flowing cooling liquid and thermally connected to at least one of said semiconductor elements, and a heat exchanging radiator, wherein a plurality of said electronic circuit boards is installed in said body of equipment, and further comprising a second header having an inside flow passage capable of flowing cooling liquid, said second header being thermally connected to said heat exchanging radiator, a plurality of said first headers being provided and thermally connected to said second header by flexible tubes, a liquid transmitting mechanism to reciprocally transmit cooling liquid between said first headers and said second header, said liquid transmitting mechanism being provided in said second header, said heat exchanging radiator being positioned in isolated relationship with the at least one semiconductor element to which said first headers are thermally connected, said liquid transmitting mechanism including at least a pair of bellows which are respectively provided at each end of a flow passage in said second header.

7. An electronic equipment according to any one of claim 1, claim 2, claim 3, claim 4, claim 5 and claim 6, comprising:
said heat exchanging radiator being placed near a wall of said body of equipment; and
an air blowing opening communicating to the outside of the body of equipment being provided on the wall of said body of equipment at a position where said heat exchanging radiator is placed.

8. An electronic equipment according to any one of claim 1 and claim 11, wherein said electronic equipment is a lap-top type electronic equipment and said body of equipment includes a first body of equipment containing said electronic circuit board mounting said plurality of semiconductor elements thereon and a second body of equipment containing a display unit and being rotatably connected to said first body of equipment.

9. An electronic equipment according to claim 1, wherein said at least one flexible tube connects said header and said heat exchanging radiator for flowing cooling liquid therethrough, said at least one flexible tube having an inner diameter smaller than 2 mm.

10. An electronic equipment according to claim 1, wherein said at least one flexible tube connects said header and said heat exchanging radiator for flowing cooling liquid therethrough, said at least one flexible tube being made of silicon rubber or ethylene tetra-fluoride resin.

11. An electronic equipment according to claim 6, wherein at least one of said flexible tubes has an inner diameter smaller than 2 mm.

12. An electronic equipment according to claim 6, wherein at least one of said flexible tubes is made of silicon rubber or ethylene tetra-fluoride resin.

13. An electronic equipment according to claim 1, wherein said heat exchanging radiator comprises a second header having an inside flow passage capable of flowing cooling liquid and a heat exchanging radiator member thermally connected to said second header, a plurality of said first headers being provided and thermally connected to said second header by a plurality of said flexible tubes.

14. An electronic equipment according to any one of claim 1 and claim 11, wherein the plurality of semiconductor elements include high heat generating semiconductor elements and low heat generating semiconductor elements, and a plurality of electronic circuit boards are provided, the electronic circuit boards mounting at least one high heat generating semiconductor element being arranged horizontally and densely piled in a multi-stage arrangement in said body, and the electronics circuit boards mounting low heat generating semiconductor elements being arranged vertically and thinly arrayed in said body.

* * * * *

UNITED STATES PATENT AND TRADEMARK OFFICE
CERTIFICATE OF CORRECTION

PATENT NO.  : 5,646,824

DATED  : July 8, 1997

INVENTOR(S)  : Shigeo Ohashi, et. al.

It is certified that error appears in the above-identified patent and that said Letters Patent is hereby corrected as shown below:

The Title page should be deleted and substitute therefor the attached Title page.

Signed and Sealed this

Fourth Day of August, 1998

Attest:

Attesting Officer

BRUCE LEHMAN

Commissioner of Patents and Trademarks

United States Patent [19]

Ohashi et al.

[11] Patent Number: 5,646,824
[45] Date of Patent: Jul. 8, 1997

[54] ELECTRONIC EQUIPMENT AND LAP-TOP TYPE ELECTRONIC EQUIPMENT

[75] Inventors: Shigeo Ohashi; Toshio Hatada, both of Tsuchiura; Takeo Tanaka, Minori-machi; Susumu Iwai, Hadano, all of Japan

[73] Assignee: Hitachi, Ltd., Tokyo, Japan

[21] Appl. No.: 489,623

[22] Filed: Jun. 12, 1995

Related U.S. Application Data

[63] Continuation of Ser. No. 214,102, Mar. 17, 1994, abandoned.

[30] Foreign Application Priority Data

Mar. 17, 1993 [JP] Japan ................................. 5-056804

[51] Int. Cl.⁶ ........................................................ H05K 7/20
[52] U.S. Cl. ..................... 361/699; 165/80.3; 174/15.1; 257/714; 361/704
[58] Field of Search ............................. 165/80.2, 80.3, 165/80.4, 104.31, 104.33; 174/15.1, 16.1, 16.3; 257/714; 361/687–689, 699, 704, 710–711, 694–697

[56] References Cited

U.S. PATENT DOCUMENTS

| 4,698,728 | 10/1987 | Tustaniwskyj et al. | 361/699 |
| 4,791,983 | 12/1988 | Nicol et al. | 361/699 |
| 4,807,134 | 2/1989 | Tustaniwskyj et al. | 361/699 |
| 5,144,531 | 9/1992 | Go et al. | 361/699 |
| 5,285,347 | 2/1994 | Fox et al. | 361/699 |
| 5,323,847 | 6/1994 | Koizumi et al. | 361/699 |

*Primary Examiner*—Gregory D. Thompson
*Attorney, Agent, or Firm*—Antonelli, Terry, Stout & Kraus, LLP

[57] ABSTRACT

A flat shaped header having a heat receiving side is attached to a semiconductor element mounted on a circuit board. The header having the heat receiving side is connected to another header having a heat receiving side attached to a plurality of heat radiating fins so as to form a heat exchanging radiator which heat radiating fins are installed at a peripheral portion of a body of electronic equipment. The heat generated by the semiconductor element is transmitted by liquid moving between the headers via flexible tubes and then to the heat radiating fins, which heat is discharged outside of the body of equipment. Since the flat shaped header and the flexible tubes are employed, a high heat generating semiconductor element and the heat radiating fins are thermally connected with ease without being influenced by the configurational condition in the equipment even when many semiconductor elements are mounted inside a small space.

14 Claims, 8 Drawing Sheets